United States Patent [19]
Schmidt et al.

[11] Patent Number: 5,283,233
[45] Date of Patent: Feb. 1, 1994

[54] METHOD FOR PRODUCING A SUPERCONDUCTOR LAYER OF YBA$_2$CU$_3$O$_7$ ON A SAPPHIRE SUBSTRATE

[75] Inventors: Harald Schmidt; Klaudia Hradil, both of Munich; Wolfram Wersing, Kirchheim, all of Fed. Rep. of Germany

[73] Assignee: Siemens Aktiengesellschaft, Munich, Fed. Rep. of Germany

[21] Appl. No.: 770,245

[22] Filed: Oct. 3, 1991

[30] Foreign Application Priority Data

Oct. 26, 1990 [DE] Fed. Rep. of Germany ....... 4034168

[51] Int. Cl.$^5$ .................... H01L 39/12; B05D 3/02
[52] U.S. Cl. .................... 505/1; 204/192.12; 427/62; 427/419.3; 505/731
[58] Field of Search ............. 427/62, 5.95, 419.3; 505/1, 731, 725; 204/192.12

[56] References Cited

U.S. PATENT DOCUMENTS 4,880,772 11/1989 Penderson et al. ............. 427/62
5,015,623 5/1991 Scholten .................... 427/62

FOREIGN PATENT DOCUMENTS 3064068 4/1990 European Pat. Off. .

OTHER PUBLICATIONS

K. Char et al, "Microwave surface resistance of epitaxial YBa$_2$Cu$_3$O$_7$ thin films on sapphire", *Appl. Phys. Lett* vol. 57, No. 4, 23 Jul. 1990, pp. 409-411.

K. Konushi et al, "Epitaxial Growth of Zirconia and Yttria Stabilized Zirconia Films on Sapphire Substrates by Reactive Sputtering", *Mat. Res. Soc. Symp. Proc.*, vol. 56, 1986, pp. 259-264.

Schmidt et al, "Epitaxial YBa$_2$Cu$_3$O$_x$ thin films on sapphire using a Y-stabilized ZrO$_2$ buffer layer", *Applied Physics Letters*, vol. 59, No. 2, 8 Jul. 1991, pp. 222-224.

Patent Apstracts of Japan, Mar. 15, 1990, vol. 014137, Group C0702 of Japanese Published Application 2011751 of Jan. 16, 1990.

Myoren et al, "As-Grown Preparation of Superconducting Epitaxial Ba$_2$YCu$_3$O$_x$ Thin Films Sputtered on Epitaxially Grown ZrO$_2$/Si(100)", *Japanese Journal of Applied Physics*, vol. 28, No. 3, Mar. 28, 1989, pp. 351-355.

Hess et al, "Preparation and patterning of YBaCUO thin films obtained by sequential deposition of CuO$_x$-/Y$_2$O$_3$/BaF$_2$", *Applied Physics Letters*, vol. 53, No. 8, Aug. 22, 1988, pp. 698-699.

Boucher et al, "Comparison de l'Ablation Laser et de la Pulverisation DC-Magnetron pour l'Epitaxie de Films YBa$_2$Cu$_3$O$_{7-x}$ a Partir de Monocibles", *Le Vide, Les Couches Minces*, vol. 45, No. 252, 1990, pp. 170-171. Jul. 1990.

*Primary Examiner*—Jan H. Silbaugh
*Assistant Examiner*—Christopher A. Fiorilla
*Attorney, Agent, or Firm*—Hill, Steadman & Simpson

[57] ABSTRACT

A method for producing a superconducting layer of YBa$_2$CU$_3$O$_7$ on a sapphire substrate utilizes the steps of epitaxially growing an intermediate layer that at least contains a yttrium-stabilized zirconium oxide layer directly on the substrate, and then epitaxially growing a superconducting layer on the intermediate layer. In one embodiment, the step of growing the intermediate layer grows two sub-layers, with the first sub-layer being a yttrium-stabilized zirconium oxide layer and a second sub-layer being a yttrium oxide layer applied onto the first sub-layer.

4 Claims, 1 Drawing Sheet

METHOD FOR PRODUCING A SUPERCONDUCTOR LAYER OF YBA$_2$CU$_3$O$_7$ ON A SAPPHIRE SUBSTRATE

BACKGROUND OF THE INVENTION

The present invention is directed to a method for producing a superconductor layer of YBa$_2$Cu$_3$O$_7$ on a substrate composed of sapphire.

Superconductor layers of high-quality YBa$_2$Cu$_3$O$_7$ on substrates composed of sapphire are required, for example, in the manufacture of microwave devices. In the manufacture of such a superconducting layer of YBa$_2$Cu$_3$O$_7$ on a substrate composed of sapphire by a direct deposit of the superconducting layer on the substrate, there is the risk of the diffusion of the aluminum from the sapphire through the superconducting layer. The temperature of the substrate must, therefore, be kept so low during the deposition that this diffusion fails to occur.

The deposition at low temperatures of the substrate, however, has the disadvantage that the superconducting layer has a faulty crystal perfection. The crystal perfection is too poor in order to supply good superconducting characteristics, such as transition temperature T$_c$ and critical current density J$_c$.

It is known, for example see an article by K. Char et al, *Appl. Phys. Lett.*, Vol. 57, 1990, pp. 409-411, to resolve the diffusion problem in that an intermediate layer is applied onto the substrate under the superconducting layer. The intermediate layer must, thereby, grow epitaxially on the substrate, which is composed of a sapphire. Over and above this, the epitaxial growth of the superconducting layer onto the intermediate layer must be possible. With respect to its grating constant, therefore, the intermediate layer must be adapted, first, to the lattice structure of the sapphire substrate and, secondly, to the lattice structure of the superconducting layer of YBa$_2$Cu$_3$O$_7$.

In the above-mentioned article by K. Char. et al, *Appl. Phys. Lett*, Vol. 57, 1990, pp. 409-411, the authors investigated an intermediate layer of SrTiO$_3$ on a substrate composed of a sapphire under a superconducting layer of YBa$_2$Cu$_3$O$_7$. A critical current density of 2 × 10$^6$ A/cm$^2$ at 74° K. was, thereby, achieved.

SUMMARY OF THE INVENTION

The object of the present invention is to provide another manufacturing method for producing a superconducting layer of YBa$_2$Cu$_3$O$_7$ on a substrate composed of sapphire, with which a further improvement of the superconducting characteristics of the superconducting layer can be achieved. The invention is achieved by a method of producing the superconducting layer of YBa$_2$Cu$_3$O$_7$ on the sapphire substrate by the steps of providing the sapphire substrate, epitaxially growing an intermediate layer that at least contains a yttrium-stabilized aluminum oxide layer on the surface of the substrate, then epitaxially growing a superconducting layer onto the intermediate layer and heating the substrate to a temperature at which the growth of both the intermediate layer and the superconducting layer will occur epitaxially.

In an article by F. Konushi et al, *Mater. Res. Soc. Symp. Pro.*, Vol. 56, 1986, pp. 259-264, the authors disclose the examination of layers of zirconium oxide or, respectively, yttrium-stabilized zirconium oxide that are grown on a sapphire substrate in view of SOI arrangement. The investigation has shown that the crystallinity of the zirconium oxide or, respectively, the yttrium-stabilized zirconium oxide is satisfactory.

The invention makes use of this perception for producing a superconducting layer of Yba$_2$Cu$_3$O$_7$ on the sapphire substrate. The superconducting layers of YBa$_2$Cu$_3$O$_7$ manufactured in this way exhibit transition temperatures of 84° K. A further improvement of the superconducting characteristic of the superconducting layer is achieved in that as the yttrium oxide layer is epitaxially grown onto the yttrium-stabilized zirconium oxide layer, the superconducting layer of YBa$_2$Cu$_2$O$_7$ is then deposited on this yttrium oxide layer.

It lies within the scope of the invention to grow the intermediate layer on the R = plane of the substrate. The R-plane corresponds to the (1$\bar{1}$02)-plane.

The temperature of the substrate in the manufacturing method of the invention must be high enough that the epitaxial growth of both the intermediate layers, as well as the superconducting layer thereon, is guaranteed. The intermediate layer is applied in a method for the deposition of thin films. In particular, by a chemical vapor deposition (CVD) methods, vacuum metallizing methods, for example with electron beams, sputtering methods, for example DC sputtering, or laser deposition methods are suitable. Especially good results are achieved when the intermediate layer is applied by an RF-magnetron sputtering with the substrate being at a temperature of at least 700° C.

The superconducting layer is, likewise, applied with the method for the deposition of thin films. In particular, the chemical vapor deposition (CVD) methods, vacuum metallizing methods, for example with electron beams, sputtering methods, for example a DC sputtering, or laser deposition methods are suitable. However, since the specimen need not be removed from the reactor and, in this case, contamination problems at the boundary surfaces will also be avoided, it is particularly advantageous to apply the superconducting layer by an RF-magnetron sputtering, which is done in the same reactor that was used for applying the intermediate layer.

Other advantages and features of the invention will be readily apparent from the following description of the preferred embodiments, the drawings and claims.

DESCRIPTION OF THE PREFERRED EMBODIMENTS

The principles of the present invention are particularly useful in a method for producing a superconductor layer 13 on an intermediate layer 12, which is applied on a sapphire substrate 11.

Figure 1:
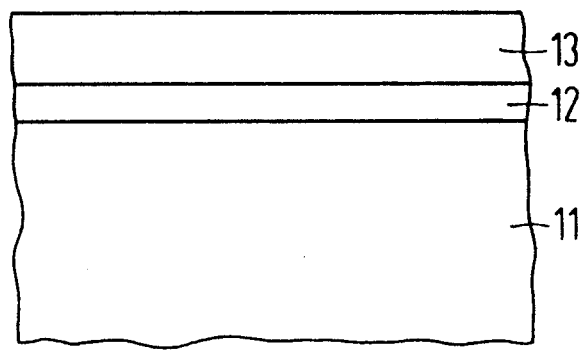
FIG. 1 is a cross sectional view of a sapphire substrate having an intermediate layer of yttrium-stabilized zirconium oxide and having a superconducting layer of YBa$_2$Cu$_3$O$_7$.
Figure 2:
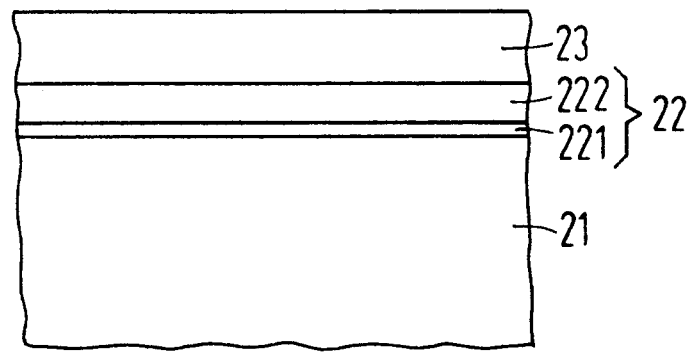
FIG. 2 is a cross sectional view of a sapphire substrate having an intermediate layer composed of a yttrium oxide sub-layer and a yttrium-stabilized zirconium oxide layer and then having a superconducting layer of YBa$_2$Cu$_3$O$_7$.

The intermediate layer 12 is epitaxially grown onto the sapphire substrate 11. For example, a wafer is employed as a substrate that has a thickness of approximately 0.5-1 mm and has a surface which is parallel to the crystallographic R-plane, which corresponds to the ($1\bar{1}02$)-plane, which extends perpendicular to the plane of the drawing of FIG. 1. For example, the intermediate layer 12 is grown by an RF-magnetron sputtering at a temperature of at least 700° C. for the substrate 11. The intermediate layer 12 is thereby composed of a yttrium-stabilized zirconium oxide and is grown to a thickness of, for example, 50-100 nm. The proportion of yttrium oxide in the yttrium-stabilized zirconium oxide amounts, for example, to 12 atomic %.

It has been documented with the assistance of Rutherford backscattering spectrometry combined with ion channeling that the intermediate layer 12 epitaxially grows under the above-recited conditions. The following parameters were observed for the deposition of the intermediate layer 12.

Sputtering gas: $Ar/O_2$ mixture having 10% $O_2$;
Sputtering pressure: $P_{Ar/O2}=0.016$ hPa; and
Substrate temperature: at least 700° C.

A superconducting layer 13 is subsequently epitaxially grown onto the intermediate layer 12. The superconducting layer is composed of $YBa_2Cu_3O_7$ and has a thickness of approximately 500 nm.

For example, the superconducting layer is likewise grown with RF-magnetron sputtering at a substrate temperature above 700° C. This has the advantage that both the intermediate layer 12 as well as the superconducting layer 13 can be produced in the same reactor. A switch between different sputtering targets must merely be undertaken in the reactor after the production of the intermediate layer 12.

It, likewise, lies within the scope of the invention to grow the superconducting layer 13 onto the intermediate layer 12, which was previously deposited by RF-magnetron sputtering, in a different reactor by a step of laser deposition.

In a second embodiment of the invention, a yttrium-stabilized zirconium oxide layer 221 is first deposited onto the surface of a sapphire substrate, which surface is in the R-plane. The yttrium-stabilized zirconium oxide layer 221 is deposited in a thickness of, for example, 50-100 nm. A yttrium oxide layer 222 having thickness of, for example, 50-100 nm is deposited on the yttrium-stabilized zirconium oxide layer 221. The yttrium-stabilized zirconium oxide layer 221 and the yttrium-oxide layer 222, together, form an intermediate layer 22 for the substrate 21. A superconducting layer 23 of the $YBa_2Cu_3O_7$ is grown onto the intermediate layer 22. The superconducting layer 23 has a thickness of approximately 500 nm. The deposition of the intermediate layer 22 and of the superconducting layer 23 occur, for example, with an RF-magnetron sputtering at a substrate temperature of at least 700° C.

A further improvement of the crystallinity of the superconducting layer 23 is achieved by employing a composite layer 22.

The following parameters were set for the deposition of the intermediate layer 22 and of the superconducting layer 23.

For the yttrium-stabilized zirconium oxide layer 221:
Sputtering gas: $Ar/O_2$ mixture having 10% $O_2$;
Sputtering pressure: $p_{Ar/O2}=0.016$ hPa; and
Sputtering temperature: at least 700° C.

For the yttrium oxide layer 222:
Sputtering gas: $Ar/O_2$ mixture having 50% $O_2$;
Sputtering pressure: $p_{Ar/O2}=0.034$ hPa; and
Sputtering temperature: at least 700° C.

For the superconducting layer 23 of $YBa_2Cu_3O_7$:
Sputtering gas: $Ar/O_2$ mixture having 30% $O_2$;
Sputtering pressure: $p_{Ar/O2}=0.7$ hPa; and
Sputtering temperature: at least 700° C.

Although various minor modifications may be suggested by those versed in the art, it should be understood that we wish to embody within the scope of the patent granted hereon all such modifications as reasonably and properly come within the scope of our contribution to the art.

We claim:

1. A method for producing a superconductor layer of $YBa_2Cu_3O_7$ on a sapphire substrate comprising the steps of providing a sapphire substrate having a surface on a R-plane of the substrate material, heating the substrate to a temperature for epitaxial growth of a layer thereon, then epitaxially growing a yttrium-stabilized zirconium oxide layer on said surface of the substrate; then epitaxially growing a yttrium oxide layer onto the yttrium-stabilized zirconium oxide layer; and then applying a superconductor layer of $YBa_2Cu_3O_7$ on the yttrium oxide layer by maintaining the temperature for epitaxial growth and by epitaxially growing the superconductor layer on the yttrium oxide layer.

2. A method according to claim 1, wherein the step of growing both the yttrium-stabilized zirconium oxide layer and the yttrium oxide layer utilizes an RF-magnetron sputtering.

3. A method according to claim 2, wherein the step of growing the superconducting layer utilizes an RF-magnetron sputtering.

4. A method according to claim 1, wherein said step of heating the substrate heats the substrate to a temperature of at least 700° C.

* * * * *